(12) United States Patent
Uchida (10) Patent No.: US 12,526,922 B2
(45) Date of Patent: Jan. 13, 2026

(54) WIRING BOARD

(71) Applicant: SHINKO ELECTRIC INDUSTRIES CO., LTD., Nagano (JP)

(72) Inventor: Kensuke Uchida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 215 days.

(21) Appl. No.: 18/347,086

(22) Filed: Jul. 5, 2023

(65) Prior Publication Data

US 2024/0015888 A1    Jan. 11, 2024

(30) Foreign Application Priority Data

Jul. 8, 2022  (JP) .................................. 2022-110703

(51) Int. Cl.
*H05K 1/11*   (2006.01)
*H05K 1/02*   (2006.01)

(52) U.S. Cl.
CPC ........... *H05K 1/115* (2013.01); *H05K 1/0298* (2013.01); *H05K 2201/0209* (2013.01); *H05K 2201/0266* (2013.01)

(58) Field of Classification Search
CPC ...... H05K 1/115; H05K 1/0298; H05K 3/284; H05K 2203/049; H05K 2203/0574; H05K 3/4644; H05K 2201/0209; H05K 2201/0266; H05K 3/4688; H01L 23/49575; H01L 23/49816; H01L 23/49827; H01L 23/49894; H01L 23/49822
See application file for complete search history.

(56) References Cited

U.S. PATENT DOCUMENTS

| | | | |
|---|---|---|---|
| 2010/0006334 A1* | 1/2010 | Takenaka | H05K 3/465 174/262 |
| 2012/0189818 A1* | 7/2012 | Hayashi | H05K 3/4655 428/323 |
| 2013/0149514 A1* | 6/2013 | Hayashi | H01L 23/145 428/323 |
| 2015/0062851 A1 | 3/2015 | Shimizu et al. | |
| 2015/0357276 A1* | 12/2015 | Shimizu | H05K 3/0055 361/783 |
| 2018/0350731 A1* | 12/2018 | Hu | H01L 23/49838 |

(Continued)

FOREIGN PATENT DOCUMENTS

JP    2015-050343    3/2015

*Primary Examiner* — Steven T Sawyer
(74) *Attorney, Agent, or Firm* — IPUSA, PLLC (57) ABSTRACT

A wiring board includes a first interconnect structure including a first interconnect layer and a first insulating layer, and a second interconnect structure, including a second interconnect layer and a second insulating layer, and disposed on the first interconnect structure. Interconnect width and spacing of the second interconnect layer are smaller than those of the first interconnect layer. The first insulating layer covers a side surface of the first interconnect layer and exposes an upper surface of the first interconnect layer. The second insulating layer covers the upper surface of the first interconnect layer and an upper surface of the first insulating layer. The first insulating layer and the second insulating layer include a filler. An average grain diameter and a maximum grain diameter of the filler included in the second insulating layer are smaller than those of the filler included in the first insulating layer.

19 Claims, 7 Drawing Sheets

(56) References Cited

U.S. PATENT DOCUMENTS

| | | | |
|---|---|---|---|
| 2019/0380210 A1* | 12/2019 | Lin ..................... | H05K 3/4617 |
| 2021/0327796 A1* | 10/2021 | Chen ................... | H05K 3/4644 |
| 2022/0078907 A1* | 3/2022 | Kim .................... | H05K 1/0298 |

* cited by examiner

WIRING BOARD

CROSS-REFERENCE TO RELATED APPLICATIONS

This application is based upon and claims priority to Japanese Patent Application No. 2022-110703, filed on Jul. 8, 2022, the entire contents of which are incorporated herein by reference.

FIELD

Certain aspects of the embodiments discussed herein are related to wiring boards, and methods for manufacturing wiring boards.

BACKGROUND

Conventionally, there is a known a multilayer wiring board in which a plurality of interconnect layers and a plurality of insulating layers are alternately laminated by a build-up method. In such a wiring board, a fine gap is intentionally provided between the insulating layer and a side surface of the interconnect layer including a via interconnect, for example. A plating is embedded in the fine gap when forming the interconnect layer, so as to improve an adhesion between the insulating layer and the side surface of the interconnect layer including the via interconnect, as proposed in Japanese Laid-Open Patent Publication No. 2015-50343, for example.

However, it is difficult to embed the plating in the fine gap. In addition, an unintended gap can be formed between the insulating layer and the side surface of the interconnect layer. The unintended gap may cause cracks to be generated in the interconnect layer and the insulating layer, and generate a disconnection or the like.

SUMMARY

Accordingly, it is an object in one aspect of the embodiments to provide a wiring board capable of reducing generation of cracks in the interconnect layer and the insulating layer.

According to one aspect of the embodiments, a wiring board includes a first interconnect structure including a first interconnect layer and a first insulating layer; and a second interconnect structure, including a second interconnect layer and a second insulating layer, and disposed on the first interconnect structure, wherein an interconnect width and an interconnect spacing of the second interconnect layer are respectively smaller than an interconnect width and an interconnect spacing of the first interconnect layer, the first insulating layer covers a side surface of the first interconnect layer and exposes an upper surface of the first interconnect layer, the second insulating layer covers the upper surface of the first interconnect layer and an upper surface of the first insulating layer, the first insulating layer and the second insulating layer include a filler, and an average grain diameter and a maximum grain diameter of the filler included in the second insulating layer are respectively smaller than an average grain diameter and a maximum grain diameter of the filler included in the first insulating layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Preferred embodiments of the present invention will be described with reference to the accompanying drawings. In the drawings, those parts that are the same are designated by the same reference numerals, and a repeated description of the same parts may be omitted.

First Embodiment

[Configuration of Wiring Board]

Figure 1A:
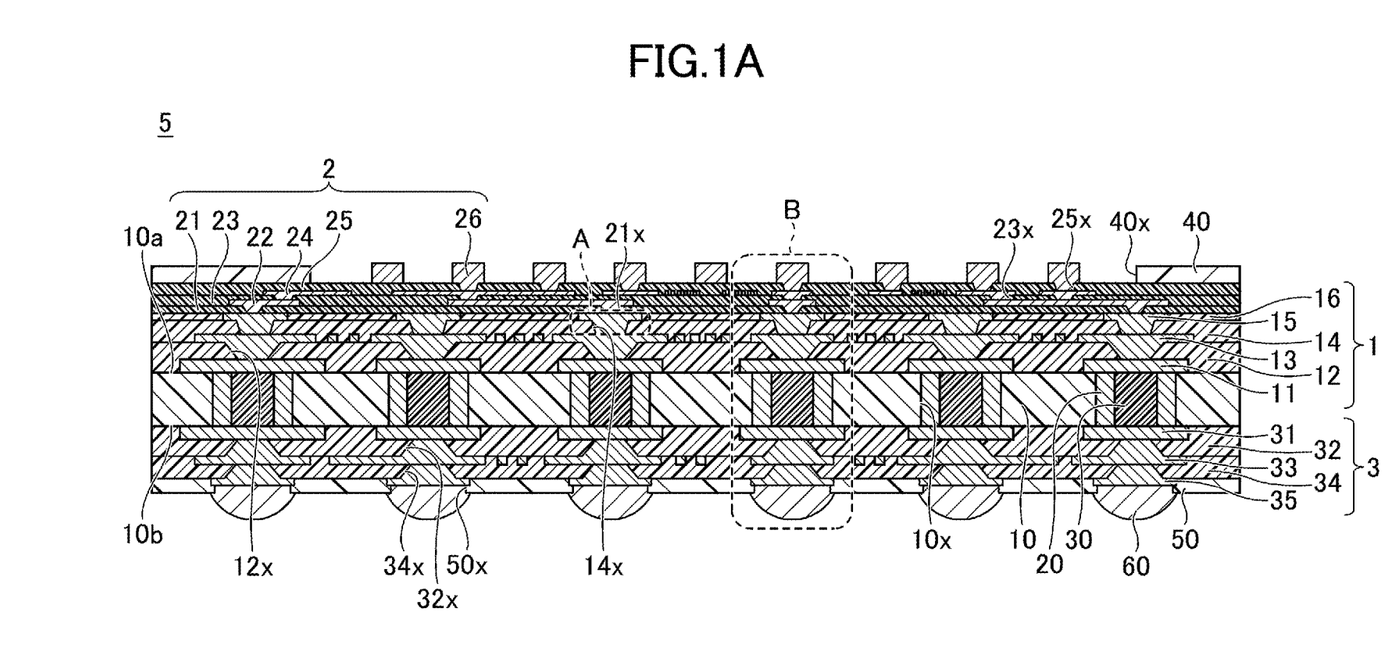
FIG. 1A and FIG. 1B are cross sectional views illustrating an example of a wiring board according to a first embodiment.
Figure 1B:
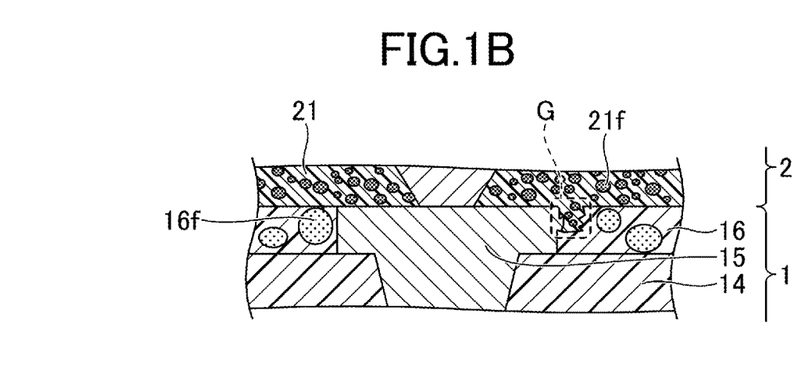

FIG. 1A and FIG. 1B are cross sectional views illustrating an example of a wiring board according to a first embodiment. FIG. 1A is an overall view of the wiring board, and FIG. 1B is an enlarged view of a part A illustrated in FIG. 1A.

As illustrated in FIG. 1A and FIG. 1B, a wiring board 5 includes a core substrate 10, a first interconnect structure 1, a second interconnect structure 2, a third interconnect structure 3, solder resist layers 40 and 50, and external connection terminals 60. The first interconnect structure 1 and the second interconnect structure 2 are disposed on one side of the core substrate 10, and the third interconnect structure 3 is disposed on the other side of the core substrate 10. The solder resist layers 40 and 50 and the external connection terminals 60 can be provided, as required.

In the present embodiment, for the sake of convenience, the side of the wiring board 5 provided with the solder resist layer 40 in FIG. 1A and FIG. 1B is referred to as an upper side or one side, and the side of the wiring board 5 provided with the solder resist layer 50 is referred to as a lower side or the other side. In addition, a surface of each portion on the side provided with the solder resist layer 40 is referred to as one surface or an upper surface, and a surface of each portion on the side provided with the solder resist layer 50 is referred to as the other surface or a lower surface. However, the wiring board 5 can be used in an upside-down state, or can be used in a state inclined at an arbitrary angle.

A plan view of an object refers to a view of the object in a normal direction to one surface (or upper surface) of the solder resist layer 40, and a planar shape of the object refers to a shape of the object in the plan view viewed in the normal direction to the one surface (or upper surface) of the solder resist layer 40.

A so-called glass epoxy substrate in which a glass cloth is impregnated with a thermosetting insulating resin, such as an epoxy-based resin or the like, for example, can be used for the core substrate 10. A substrate in which a woven fabric or a nonwoven fabric of glass fiber, carbon fiber, aramid fiber, or the like, is impregnated with the thermosetting insulating resin, such as the epoxy-based resin or the like, may also be used for the core substrate 10. A thickness of the core substrate 10 can be in a range of approximately 80 μm to approximately 1200 μm, for example. In the drawings, illustration of the glass cloth or the like will be omitted.

A plurality of through holes 10x, penetrating the core substrate 10, are formed in the core substrate 10. The planar shape of the through holes 10x can be a circular shape having a diameter in a range of approximately 50 μm to approximately 100 μm, for example. A pitch of the through holes 10x can be in a range of approximately 100 μm to approximately 1000 μm, for example. A via electrode 20 is famed on an internal wall surface of the through hole 10x, and a resin part 30 fills a center portion of the through hole 10x (inside of the via electrode 20). A material used for the via electrode 20 can be copper (Cu) or the like, for example. A thickness of the via electrode 20 can be in a range of approximately 15 μm to approximately 35 μm, for example. A material used for the resin part 30 can be a thermosetting insulating resin, such as an epoxy-based resin or the like, for example.

The first interconnect structure 1 is laminated on one surface 10a of the core substrate 10. The first interconnect structure 1 is a laminated interconnect structure in which a plurality of first interconnect layers and a plurality of first insulating layers are laminated. In the present embodiment, the plurality of first interconnect layers include a first interconnect layer 11, a first interconnect layer 13, and a first interconnect layer 15. The first interconnect layer 15 is an uppermost first interconnect layer disposed closest to the second interconnect structure 2, among the plurality of first interconnect layers. The number of first interconnect layers that are provided is not limited to the number in the example of the present embodiment. Only a single first interconnect layer can be provided. In the present embodiment, the plurality of first insulating layers include a first insulating layer 12, a first insulating layer 14, and a first insulating layer 16. The first insulating layer 16 is an uppermost first insulating layer disposed closest to the second interconnect structure 2, among the plurality of first insulating layers. The number of first insulating layers that are provided is not limited to the number in the example of the present embodiment. Only a single first insulating layer can be provided.

The third interconnect structure 3 is laminated on the other surface 10b of the core substrate 10. The third interconnect structure 3 is a laminated interconnect structure in which a plurality of third interconnect layers and a plurality of third insulating layers are laminated. In the present embodiment, the plurality of third interconnect layers include a third interconnect layer 31, a third interconnect layer 33, and a third interconnect layer 35. The number of third interconnect layers that are provided is not limited to the number in the example of the present embodiment. In the present embodiment, the plurality of third insulating layers include a third insulating layer 32, and a third insulating layer 34. The number of third insulating layer is not limited to the number in the example of the present embodiment.

The first interconnect layer 11 includes an interconnect pattern formed on the one surface 10a of the core substrate 10. The third interconnect layer 31 includes an interconnect pattern formed on the other surface 10b of the core substrate 10. The first interconnect layer 11 is electrically connected to the third interconnect layer 31 through the via electrode 20 penetrating the core substrate 10. The first interconnect layer 11 and the third interconnect layer 31 are formed of a metal foil, such as a copper foil or the like, or a plating layer, such as a copper plating layer or the like, for example. A thickness of each of the first interconnect layer 11 and the third interconnect layer 31 can be in a range of approximately 15 μm to approximately 35 μm, for example. A line-and-space (line/space) of each of the first interconnect layer 11 and the third interconnect layer 31 can be in a range of approximately 10 μm/10 μm to approximately 50 μm/50 μm for example.

The line of the line-and-space represents an interconnect width, and the space of the line-and-space represents a spacing (interconnect spacing) between two adjacent interconnects. In a case where the line-and-space is indicated as 10 μm/10 μm to 50 μm/50 μm for example, this represents an interconnect width greater than or equal to 10 μm and less than or equal to 50 μm, and a spacing (interconnect spacing) between two adjacent interconnects greater than or equal to 10 μm and less than or equal to 50 μm. The interconnect width and the interconnect spacing may not necessarily be equal to each other.

The first insulating layer 12 is formed on the one surface 10a of the core substrate 10, so as to cover the first interconnect layer 11. The third insulating layer 32 is formed on the other surface 10b of the core substrate 10, so as to cover the third interconnect layer 31. The first insulating layer 12 and the third insulating layer 32 are insulating layers including a non-photosensitive resin as a main component thereof. The first insulating layer 12 and the third insulating layer 32 can include a thermosetting non-photosensitive resin, such as an epoxy-based resin, an imide-based resin, a phenol-based resin, a cyanate-based resin, or the like as a main component thereof, for example. A thickness of each of the first insulating layer 12 and the third insulating layer 32 can be in a range of approximately 20 μm to approximately 40 μm, for example. The first insulating layer 12 and the third insulating layer 32 may include a filler, such as silica ($SiO_2$) or the like. An average grain diameter of the filler, a maximum grain diameter of the filler, and a filler content included in the first insulating layer 12 and the third insulating layer 32 can be the same as those of a filler 16f included in the first insulating layer 16, for example, which will be described later. The average grain diameter and the maximum grain diameter of the filler can be measured using a scanning electron microscope.

The first interconnect layer 13 is formed on one surface of the first insulating layer 12, and is electrically connected to the first interconnect layer 11. The first interconnect layer 13 includes a via interconnect filling an inside of a via hole 12x that penetrates the first insulating layer 12 and exposes one surface of the first interconnect layer 11, and an interconnect pattern formed on the one surface of the first insulating layer 12. The via hole 12x can be a cavity having an inverted truncated cone shape, and a diameter of a first opening of the cavity at one end which opens upward toward the first insulating layer 14 is greater than a diameter of a second opening of the cavity at the other end (that is, a bottom surface of the cavity) formed by the upper surface of the first interconnect layer 11. The diameter of the first opening of the cavity of the via hole 12x, for example, may also be referred to as a hole diameter of the via hole 12x, and the same applies to the other via holes.

The third interconnect layer 33 is formed on the other surface of the third insulating layer 32, and is electrically connected to the third interconnect layer 31. The third interconnect layer 33 includes a via interconnect filling an inside of a via hole 32x that penetrates the third insulating layer 32 and exposes the other surface of the third interconnect layer 31, and an interconnect pattern formed on the other surface of the third insulating layer 32. The via hole 32x can be a cavity having a truncated cone shape, and a diameter of a first opening of the cavity at one end which opens downward toward the third insulating layer 34 is greater than a diameter of a second opening of the cavity at the other end (that is, a bottom surface of the cavity) formed by the lower surface of the third interconnect layer 31.

The diameter of the first opening of each of the via holes 12x and 32x can be in a range of approximately 50 μm to approximately 60 μm, for example. A material used for the first interconnect layer 13 and the third interconnect layer 33 can be copper or the like, for example. A thickness of the interconnect patterns of the first interconnect layer 13 and the third interconnect layer 33 can be in a range of approximately 15 μm to approximately 25 μm, for example. The line-and-space of the interconnect patterns of the first interconnect layer 13 and the third interconnect layer 33 can be in a range of approximately 10 μm/10 μm to approximately 50 μm/50 μm, for example.

The first insulating layer 14 is formed on the one surface of the first insulating layer 12, so as to cover the first interconnect layer 13. The third insulating layer 34 is formed on the other surface of the third insulating layer 32, so as to cover the third interconnect layer 33. A material used for and a thickness of the first insulating layer 14 and the third insulating layer 34 can be the same as those of the first insulating layer 12 and the third insulating layer 32, for example. The first insulating layer 14 and the third insulating layer 34 may include a filler, such as silica ($SiO_2$) or the like. An average grain diameter of the filler, a maximum grain diameter of the filler, and a filler content of the filler included in the first insulating layer 14 and the third insulating layer 34 can be the same as those of the filler 16f included in the first insulating layer 16, for example, which will be described later.

The first interconnect layer 15 is formed on one surface of the first insulating layer 14, and is electrically connected to the first interconnect layer 13. The first interconnect layer 15 includes a via interconnect filling an inside of a via hole 14x that penetrates the first insulating layer 14 and exposes one surface of the first interconnect layer 13, and an interconnect pattern formed on the one surface of the first insulating layer 14. The via hole 14x can be a cavity having an inverted truncated cone shape, and a diameter of a first opening of the cavity at one end which opens upward toward the first insulating layer 16 is greater than a diameter of a second opening of the cavity at the other end (that is, a bottom surface of the cavity) formed by the upper surface of the first interconnect layer 13.

The third interconnect layer 35 is formed on the other surface of the third insulating layer 34, and is electrically connected to the third interconnect layer 33. The third interconnect layer 35 includes a via interconnect filling an inside of a via hole 34x that penetrates the third insulating layer 34 and exposes the other surface of the third interconnect layer 33, and an interconnect pattern formed on the other surface of the third insulating layer 34. The via hole 34x can be a cavity having a truncated cone shape, and a diameter of a first opening of the cavity at one end which opens downward toward the solder resist layer 50 is greater than a diameter of a second opening of the cavity at the other end (that is, a bottom surface of the cavity) formed by the lower surface of the third interconnect layer 33.

The diameter of the first opening of each of the via holes 14x and 34x can be in a range of approximately 50 μm to approximately 60 μm, for example. A material used for the first interconnect layer 15 and the third interconnect layer 35, a thickness of the interconnect patterns of the first interconnect layer 15 and the third interconnect layer 35, and the line-and-space of the interconnect patterns of the first interconnect layer 15 and the third interconnect layer 35 can be the same as those of the first interconnect layer 13 and the third interconnect layer 33, for example.

The first insulating layer 16 is formed on the upper surface of the first insulating layer 14, so as to cover a side surface of the first interconnect layer 15 and expose the upper surface of the first interconnect layer 15. A material used for the first insulating layer 16 can be the same as that used for the first insulating layer 12, for example. The first insulating layer 16 includes the filler 16f, such as silica ($SiO_2$) or the like. An average grain diameter of the filler 16f can be less than or equal to 0.5 μm, for example. A maximum grain diameter of the filler 16f can be less than or equal to 5 μm, for example. A filler content of the filler 16f can be approximately 72 wt %, for example. The average grain diameter and the maximum grain diameter of the filler 16f included in the first insulating layer 16 are respectively larger than the average grain diameter and the maximum grain diameter of a filler 21f included in the second insulating layer 21, for example, which will be described later.

A thickness of the first insulating layer 16 can be in a range of approximately 5 μm to approximately 15 μm, for example. The thickness of the first insulating layer 16 is the same as the thickness of the interconnect pattern foiling the first interconnect layer 15, and the upper surface of the first insulating layer 16 coincides with the upper surface of the first interconnect layer 15. A roughness Ra of the upper surface of the first insulating layer 16 can be in a range of approximately 20 nm to approximately 60 nm, for example. A roughness Ra of the upper surface of each of the first insulating layers 12 and 14 can be in a range of approximately 150 nm to approximately 200 nm, for example. That is, the roughness Ra of the upper surface of the first insulating layer 16 is smaller than the roughness Ra of the upper surface of each of the first insulating layers other than the first insulating layer 16.

The second interconnect structure 2 is disposed on the first interconnect structure 1. The second interconnect structure 2 is a laminated interconnect structure in which a plurality of second interconnect layers and a plurality of second insulating layers are laminated. In the present embodiment, the plurality of second interconnect layers include a second interconnect layer 22, a second interconnect layer 24, and a second interconnect layer 26. The second interconnect layer 22 is the lowermost second interconnect layer disposed closest to the first interconnect structure 1, among the plurality of second interconnect layers. The number of second interconnect layers is not limited to the number in the example of the present embodiment. Only a single second interconnect layer can be provided.

In the present embodiment, the plurality of second insulating layers include a second insulating layer 21, a second insulating layer 23, and a second insulating layer 25. The second insulating layer 21 is the lowermost second insulating layer disposed closest to the first interconnect structure 1, among the plurality of second insulating layers. The number of second insulating layers is not limited to the number in the example of the present embodiment. Only a single second insulating layer can be provided.

The interconnect width and the interconnect spacing of the second interconnect layer are respectively smaller than the interconnect width and the interconnect spacing of the first interconnect layer. Further, the interconnect width and the interconnect spacing of the second interconnect layer are respectively smaller than the interconnect width and the interconnect spacing of the third interconnect layer. That is, the second interconnect layer forming the second interconnect structure 2 is a fine (or micro) interconnect layer having a higher interconnect density than those of the first interconnect layer forming the first interconnect structure 1 and the third interconnect layer forming the third interconnect structure 3.

The second insulating layer 21 is formed so as to cover the upper surface of the first interconnect layer 15 and the upper surface of the first insulating layer 16 of the first interconnect structure 1. The second insulating layer 21 is an insulating layer including a non-photosensitive resin as a main component thereof. The main component of the second insulating layer 21 can be a thermosetting non-photosensitive resin, such as an epoxy-based resin, an imide-based resin, a phenol-based resin, a cyanate-based resin, or the like, for example. The second insulating layer 21 includes the filler 21f, such as silica ($SiO_2$) or the like. An average grain diameter and a maximum grain diameter of the filler 21f included in the second insulating layer 21 are respectively smaller than the average grain diameter and the maximum grain diameter of the filler 16f included in the first insulating layer 16. The average grain diameter of the filler 21f can be less than or equal to 0.1 μm, for example. The maximum grain diameter of the filler 21f can be less than or equal to 1 μm, for example. A filler content of the filler 21f can be approximately 50 wt %, for example. The second insulating layer 21 is an insulating layer thinner than each of the first insulating layers 12 and 14. A thickness of the second insulating layer 21 can be in a range of approximately 10 μm to approximately 20 μm, for example.

The second interconnect layer 22 is formed on one surface of the second insulating layer 21, and is electrically connected to the first interconnect layer 15 of the first interconnect structure 1. The second interconnect layer 22 includes a via interconnect filling an inside of a via hole 21x that penetrates the second insulating layer 21 and exposes the one surface of the first interconnect layer 15, and an interconnect pattern formed on the one surface of the second insulating layer 21. The via hole 21x can be a cavity having an inverted truncated cone shape, and a diameter of a first opening of the cavity at one end which opens upward toward the second insulating layer 23 is greater than a diameter of a second opening of the cavity at the other end (that is, a bottom surface of the cavity) formed by the upper surface of the first interconnect layer 15. The diameter of the first opening of the via hole 21x can be in a range of approximately 5 μm to approximately 10 μm, for example. A material used for the second interconnect layer 22 can be copper or the like, for example. A thickness of the interconnect pattern forming the second interconnect layer 22 can be in a range of approximately 5 μm to approximately 10 μm, for example. A line-and-space of the interconnect pattern forming the second interconnect layer 22 can be in a range of approximately 3 μm/3 μm to approximately 8 μm/8 μm, for example.

The second insulating layer 23 is formed on one surface of the second insulating layer 21, so as to cover the second interconnect layer 22. A material used for the second insulating layer 23 and a thickness of the second insulating layer 23 can be the same as those of the second insulating layer 21, for example. The second insulating layer 23 may include a filler, such as silica ($SiO_2$) or the like. An average grain diameter and a maximum grain diameter of the filler included in the second insulating layer 23 are respectively smaller than the average grain diameter and the maximum grain diameter of the filler included in each of the first insulating layers. The average grain diameter of the filler included in the second insulating layer 23, the maximum grain diameter of the filler, and the filler content of the filler can be the same as those of the filler 21f included in the second insulating layer 21, for example.

The second interconnect layer 24 is formed on one surface of the second insulating layer 23, and is electrically connected to the second interconnect layer 22. The second interconnect layer 24 includes a via interconnect filling an inside of a via hole 23x that penetrates the second insulating layer 23 and exposes one surface of the second interconnect layer 22, and an interconnect pattern formed on the one surface of the second insulating layer 23. The via hole 23x can be a cavity having an inverted truncated cone shape, and a diameter of a first opening of the cavity at one end which opens upward toward the second insulating layer 25 is greater than a diameter of a second opening of the cavity at the other end (that is, a bottom surface of the cavity) formed by the upper surface of the second interconnect layer 22. A diameter of the first opening of the via hole 23x can be in a range of approximately 5 μm to approximately 10 μm, for example. A material used for the second interconnect layer 24, a thickness of the interconnect pattern forming the second interconnect layer 24, and a line-and-space of the interconnect pattern forming the second interconnect layer 24 can be the same as those of the second interconnect layer 22, for example.

The second insulating layer 25 is formed on one surface of the second insulating layer 23, so as to cover the second interconnect layer 24. A material used for the second insulating layer 25 and a thickness of the second insulating layer 25 can be the same as those of the second insulating layer 23, for example. The second insulating layer 25 may include a filler, such as silica ($SiO_2$) or the like. An average grain diameter and a maximum grain diameter of the filler included in the second insulating layer 25 are respectively smaller than the average grain diameter and the maximum grain diameter of the filler included in each of the first insulating layers. The average grain diameter of the filler included in the second insulating layer 25, the maximum grain diameter of the filler, and the filler content of the filler can be the same as those of the filler 21f included in the second insulating layer 21, for example.

The second interconnect layer 26 is formed on one surface of the second insulating layer 25, and is electrically connected to the second interconnect layer 24. The second interconnect layer 26 includes a via interconnect filling an inside of a via hole 25x that penetrates the second insulating layer 25 and exposes one surface of the second interconnect layer 24, and an interconnect pattern and a pad formed on the one surface of the second insulating layer 25. The via hole 25x can be a cavity having an inverted truncated cone shape, and a diameter of a first opening of the cavity at one end which opens upward toward the solder resist layer 40 is greater than a diameter of a second opening of the cavity at the other end (that is, a bottom surface of the cavity) formed by the upper surface of the second interconnect layer 24. The diameter of the opening of the via hole 25x can be in a range of approximately 5 μm to approximately 10 μm, for example.

A material used for the second interconnect layer 26 and a thickness of the interconnect pattern forming the second interconnect layer 26 can be the same as those of the second interconnect layer 22, for example. A thickness of the pad forming the second interconnect layer 26 can be in a range of approximately 10 μm to approximately 20 μm, for example. The planar shape of the pad forming the second interconnect layer 26 can be a circular shape having a diameter in a range of approximately 20 μm to approximately 30 μm, for example. A pitch of the pads forming the second interconnect layer 26 can be in a range of approximately 40 μm to approximately 50 μm, for example. The pad forming the second interconnect layer 26 functions as an electronic component mounting pad for electrically connecting to an electronic component, such as a semiconductor chip or the like.

A surface-treated layer (not illustrated) can be formed on a surface (only on an upper surface, or on the upper surface and a side surface) of the pad forming the second interconnect layer 26. Examples of the surface-treated layer include a Au layer, a Ni/Au layer (a metal layer having a Ni layer and a Au layer that are laminated in this order), a Ni/Pd/Au layer (a metal layer having a Ni layer, a Pd layer, and a Au layer that are laminated in this order), or the like. In addition, the surface-treated layer can be formed by performing an anti-oxidation treatment, such as an organic solderability preservative (OSP) treatment or the like, on the surface (only on the upper surface, or on the upper surface and the side surface) of the pad forming the second interconnect layer 26.

The solder resist layer 40 is an outermost insulating layer formed on an outer peripheral side of one surface of the second insulating layer 25 of the second interconnect structure 2. A material used for the solder resist layer 40 can be a photosensitive insulating resin including a phenol-based resin, a polyimide-based resin, or the like as a main component thereof, for example. The solder resist layer 40 may include a filler, such as silica ($SiO_2$) or the like. The solder resist layer 40 has an opening 40x, and a portion of the second interconnect layer 26 is exposed inside the opening 40x.

The solder resist layer 50 is an outermost insulating layer formed on the other surface of the third insulating layer 34 of the third interconnect structure 3, so as to cover the third interconnect layer 35 of the third interconnect structure 3. A material used for the solder resist layer 50 can be a photosensitive insulating resin including a phenol-based resin, a polyimide-based resin, or the like as a main component thereof, for example. The solder resist layer 40 may include a filler, such as silica ($SiO_2$) or the like.

The solder resist layer 50 has an opening 50x, and a portion of the third interconnect layer 35 of the third interconnect structure 3 is exposed at a bottom of the opening 50x. The external connection terminal 60, such as a solder ball or the like, is famed on the third interconnect layer 35 exposed inside the opening 40x, as required.

As illustrated in FIG. 1B, in a manufacturing process (or step) of the wiring board 5, a gap G having a width of approximately 5 μm may be formed between the first insulating layer 16 and an outer edge of the interconnect pattern forming the first interconnect layer 15. If the gap G were left as it is, cracks would be generated in the first interconnect layer 15 and the first insulating layer 16, which may cause a disconnection or the like.

However, as will be described later, the manufacturing process of the wiring board 5 includes a process of forming the second insulating layer 21 that covers the upper surface of the first interconnect layer and the upper surface of the first insulating layer 16. During this process, an uncured second insulating resin layer is disposed to cover the upper surface of the first interconnect layer 15 and the upper surface of the first insulating layer 16, and the uncured second insulating resin layer is pressed toward the first interconnect structure 1 while being heated to be cured, thereby forming the second insulating layer 21. In this state, the softened second insulating resin layer fills the gap G and is thereafter cured, so that the gap G finally disappears. As a result, it is possible to reduce the generation of cracks in the first interconnect layer 15 and the first insulating layer 16. In addition, because a portion of the second insulating layer 21 enters inside the gap G, an anchor effect occurs, and it is possible to improve the adhesion between the second insulating layer 21 and each the first interconnect layer 15 and the first insulating layer 16.

If the second insulating layer 21 were to include the filler 16f similar to the first insulating layer 16, the average grain diameter of the filler 16f would be less than or equal to 0.5 μm and the maximum grain diameter of the filler 16f would be less than or equal to 5 μm. For this reason, in a case where the filler 16f having the relatively large grain size is present near the gap G, a problem may occur in filling the gap G having the width of approximately 5 μm, and it may not be possible to completely fill the gap G. However, because the average grain diameter of the filler 21f included in the second insulating layer 21 is less than or equal to 0.1 μm and the maximum grain diameter of the filler 21f is less than or equal to 1 μm, no problem will occur in filling the gap G having the width of approximately 5 μm. That is, in general, a filler is included in the non-photosensitive resin used for the insulating layer in order to adjust insulating properties and a thermal expansion coefficient, but when the resin is to fill in the gap as in the case of the wiring board 5, it is necessary to adjust the grain diameter of the filler by taking into consideration gap-filling properties of the filler that is to fill the gap.

[Method for Manufacturing Wiring Board]

Next, a method for manufacturing the wiring board according to the first embodiment will be described. FIG. 2A through FIG. 6B are diagrams illustrating manufacturing processes of the wiring board according to the first embodiment. The manufacturing processes of the wiring board 5 will be described by referring to a region of the wiring board 5 surrounded by a broken line B illustrated in FIG. 1A.

Figure 2A:
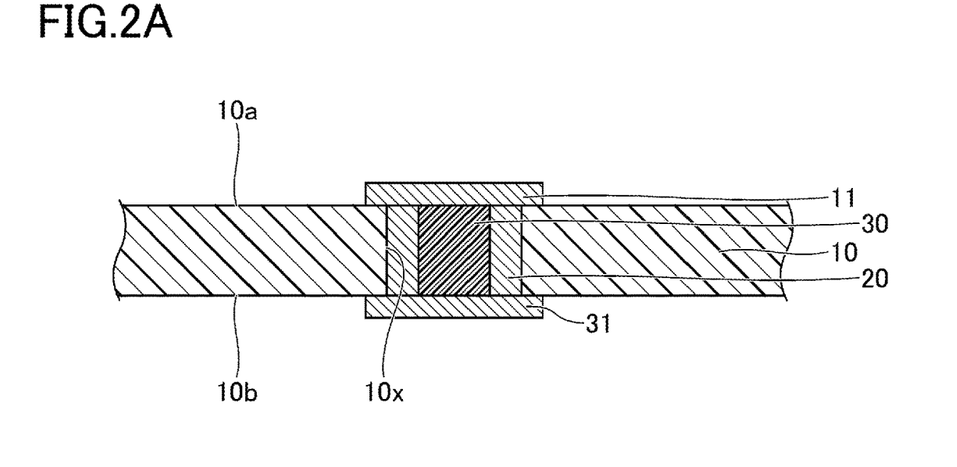
FIG. 2A, FIG. 2B, and FIG. 2C are diagrams (part 1) illustrating examples of manufacturing processes of the wiring board according to the first embodiment.

First, in the process (or step) illustrated in FIG. 2A, the core substrate 10 having the via electrode 20 is famed. More particularly, a laminated plate having an unpatterned planar copper foil formed on one surface and the other surface of the core substrate 10, such as the so-called glass epoxy substrate or the like, is prepared. Then, the copper foil on each surface of the prepared laminated plate is thinned, as required, and the through hole 10x penetrating the core substrate 10 and the copper foil on each surface thereof is thereafter formed by a laser beam machining using a $CO_2$ laser or the like.

Next, a desmear process is performed, as required, to remove a resin residue included in the core substrate 10, adhered to an inner wall surface of the through hole 10x. Then, a seed layer (copper layer or the like), covering the copper foil on each surface of the core substrate 10 and the inner wall surface of the through hole 10x, is formed by electroless plating, sputtering, or the like, and an electrolytic plating layer (copper layer or the like) is formed on the seed layer by electrolytic plating using the seed layer as a power feeding layer. Accordingly, the via electrode 20, having the electrolytic plating layer laminated on the seed layer, is formed on the inner wall of the through hole 10x. Further, the first interconnect layer 11 and the third interconnect layer 31, respectively having the copper foil, the seed layer, and the electrolytic plating layer that are successively laminated, are formed on the one surface and the other surface of the core substrate 10. Next, each of the first interconnect layer 11 and the third interconnect layer 31 is patterned into a predetermined planar shape by a subtractive method or the like. In addition, the resin part 30 fills the inner side of the via electrode 20 inside the through hole 10x.

Figure 2B:
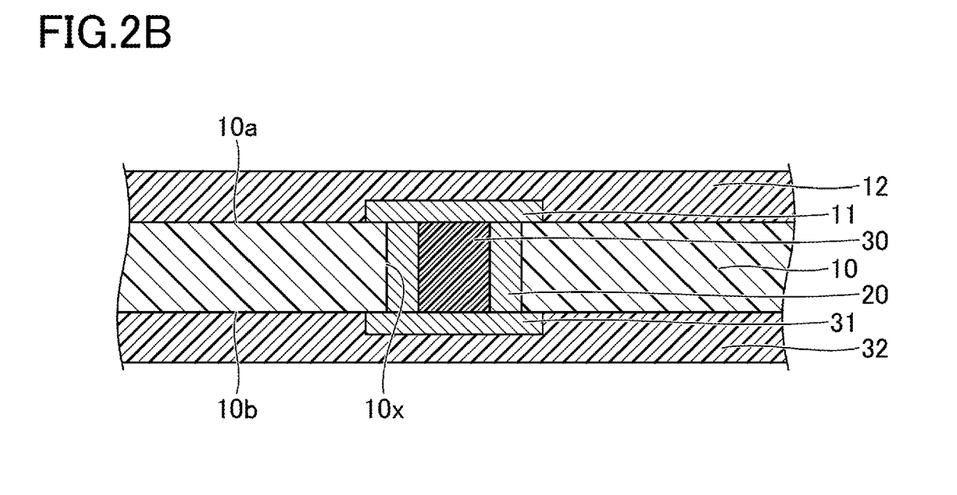

Next, in the process (or step) illustrated in FIG. 2B, the first insulating layer 12 is formed by laminating a semi-cured film of an epoxy-based resin or the like on the one surface 10a of the core substrate 10, so as to cover the first interconnect layer 11, and curing the film. In addition, the third insulating layer 32 is formed by laminating a semi-cured film of the epoxy-based resin or the like on the other surface 10b of the core substrate 10, so as to cover the third interconnect layer 31, and curing the film. Alternatively, instead of laminating the film of the epoxy-based resin, the first insulating layer 12 and the third insulating layer 32 can be formed by coating a liquid or paste of the epoxy-based resin or the like, and thereafter curing the liquid or paste of the epoxy-based resin, so as to form the first insulating layer 12 and the third insulating layer 32. The thickness of each of the first insulating layer 12 and the third insulating layer 32 can be in a range of approximately 20 μm to approximately 40 μm, for example. Each of the first insulating layer 12 and the third insulating layer 32 may include a filler, such as silica ($SiO_2$) or the like.

Figure 2C:
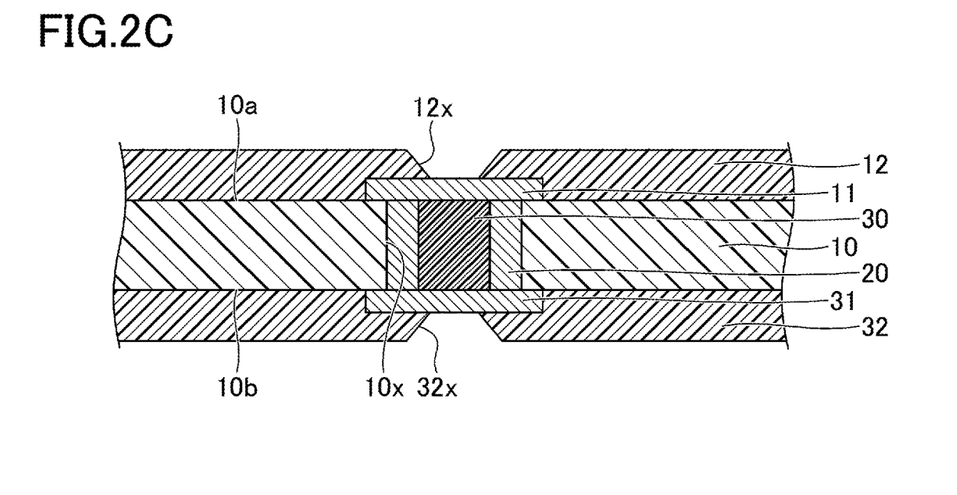

Next, in the process (or step) illustrated in FIG. 2C, the via hole 12x, that penetrates the first insulating layer 12 and exposes the upper surface of the first interconnect layer 11, is formed in the first insulating layer 12. In addition, the via hole 32x, that penetrates the third insulating layer 32 and exposes the lower surface of the third interconnect layer 31, is formed in the third insulating layer 32. The via holes 12x and 32x can be formed by the laser beam machining using a $CO_2$ laser or the like, for example. The via hole 12x can be a cavity having an inverted truncated cone shape, and a diameter of a first opening of the cavity at one end which opens upward toward the first insulating layer 14 is greater than a diameter of a second opening of the cavity at the other end (that is, a bottom surface of the cavity) formed by the upper surface of the first interconnect layer 11. In addition, the via hole 32x can be a cavity having a truncated cone shape, and a diameter of a first opening of the cavity at one end which opens downward toward the third insulating layer 34 is greater than a diameter of a second opening of the cavity at the other end (that is, a bottom surface of the cavity) formed by the lower surface of the third interconnect layer 31. After forming the via holes 12x and 32x, it is preferable to perform a desmear process to remove the resin residue adhered to the surfaces of the first interconnect layer 11 and the third interconnect layer 31 exposed at the bottoms of the via holes 12x and 32x, respectively.

Figure 3A:
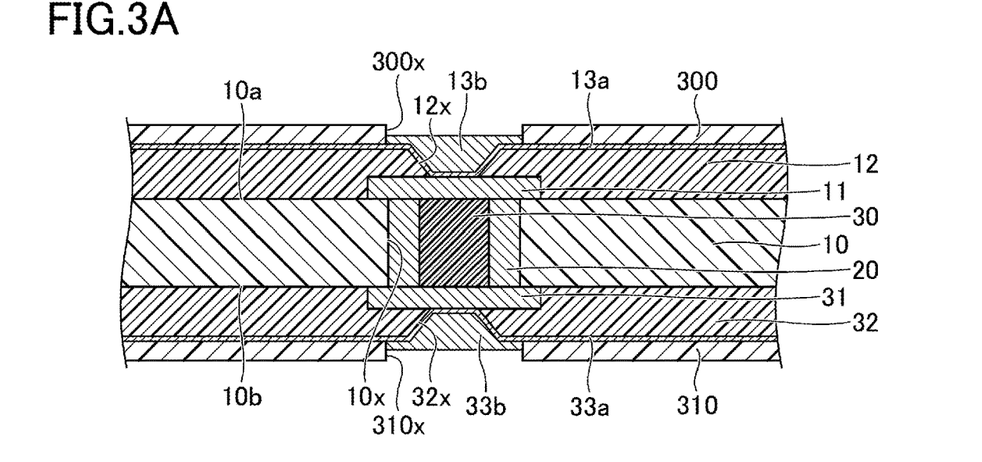
FIG. 3A, FIG. 3B, and FIG. 3C are diagrams (part 2) illustrating examples of the manufacturing processes of the wiring board according to the first embodiment.

Next, in the process (or step) illustrated in FIG. 3A, a seed layer 13a is formed on the surface of the first insulating layer 12 including the inner wall of the via hole 12x, and the surface of the first interconnect layer 11 exposed inside the via hole 12x, by electroless plating of copper, sputtering of copper, or the like. Further, a seed layer 33a is formed on the surface of the third insulating layer 32 including the inner wall of the via hole 32x, and the surface of the third interconnect layer 31 exposed inside the via hole 32x, by electroless plating of copper, sputtering of copper, or the like. A thickness of each of the seed layers 13a and 33a can be in a range of approximately 200 nm to approximately 400 nm, for example. Next, a plating resist pattern 300, having an opening 300x corresponding to the shape of the interconnect pattern of the first interconnect layer 13, is famed on the seed layer 13a. In addition, a plating resist pattern 310, having an opening 310x corresponding to the shape of the interconnect pattern of the third interconnect layer 33, is formed on the seed layer 33a.

Next, an electrolytic plating layer 13b is deposited on the seed layer 13a exposed inside the opening 300x of the plating resist pattern 300, by electrolytic plating of copper using the seed layer 13a as the power feeding layer. In addition, an electrolytic plating layer 33b is deposited on the seed layer 33a exposed inside the opening 310x of the plating resist pattern 310, by electrolytic plating of copper using the seed layer 33a as the power feeding layer.

Figure 3B:
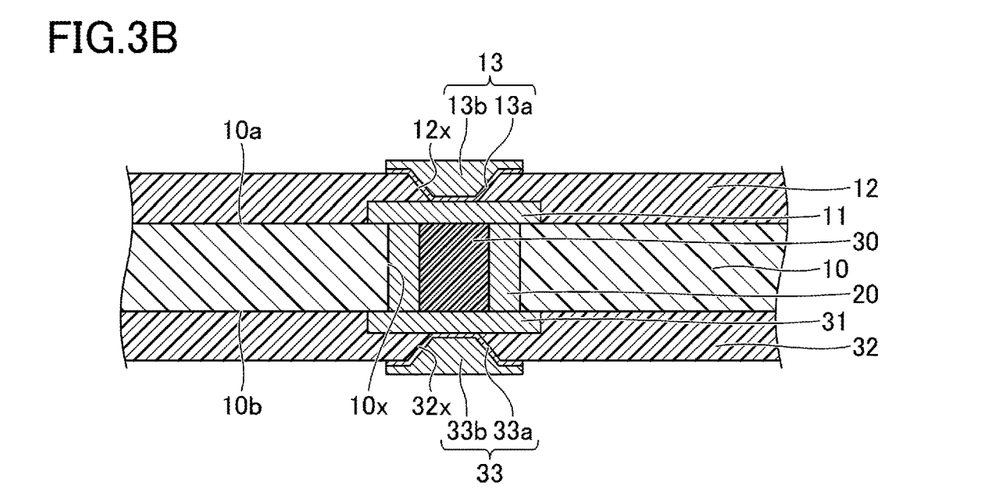

Next, in the process (or step) illustrated in FIG. 3B, the plating resist patterns 300 and 310 are removed using a plating resist remover. Then, etching is performed using the electrolytic plating layer 13b as a mask, to remove the seed layer 13a exposed from the electrolytic plating layer 13b and form the first interconnect layer 13. Moreover, etching is performed using the electrolytic plating layer 33b as a mask, to remove the seed layer 33a exposed from the electrolytic plating layer 33b and form the third interconnect layer 33.

Figure 3C:
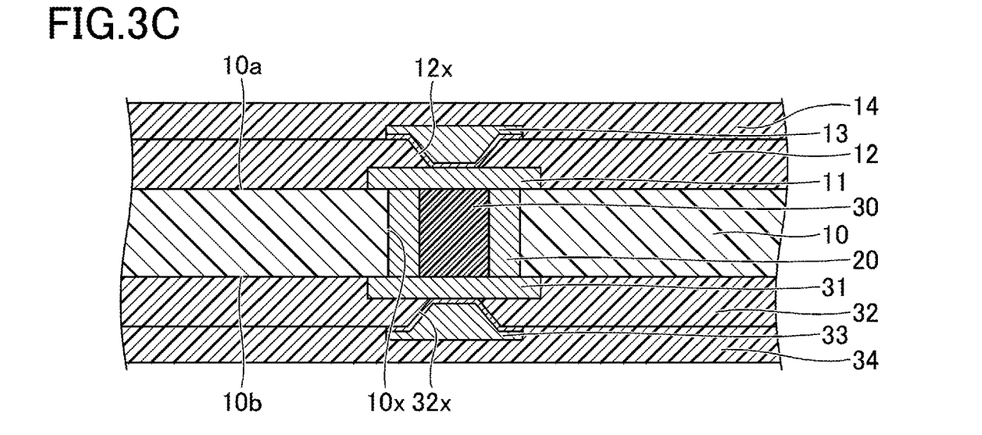

Next, in the process (or step) illustrated in FIG. 3C, the first insulating layer 14 is formed on the upper surface of the first insulating layer 12, so as to cover the first interconnect layer 13, by a method similar to the method of forming the first insulating layer 12. A material used for the first insulating layer 14 and a thickness of the first insulating layer 14 can be the same as those of the first insulating layer 12, for example. In addition, the third insulating layer 34 is formed on the lower surface of the third insulating layer 32, so as to cover the third interconnect layer 33, by a method similar to the method of forming the third insulating layer 32. A material used for the third insulating layer 34 and a thickness of the third insulating layer 34 can be the same as those of the third insulating layer 32, for example.

Figure 4A:
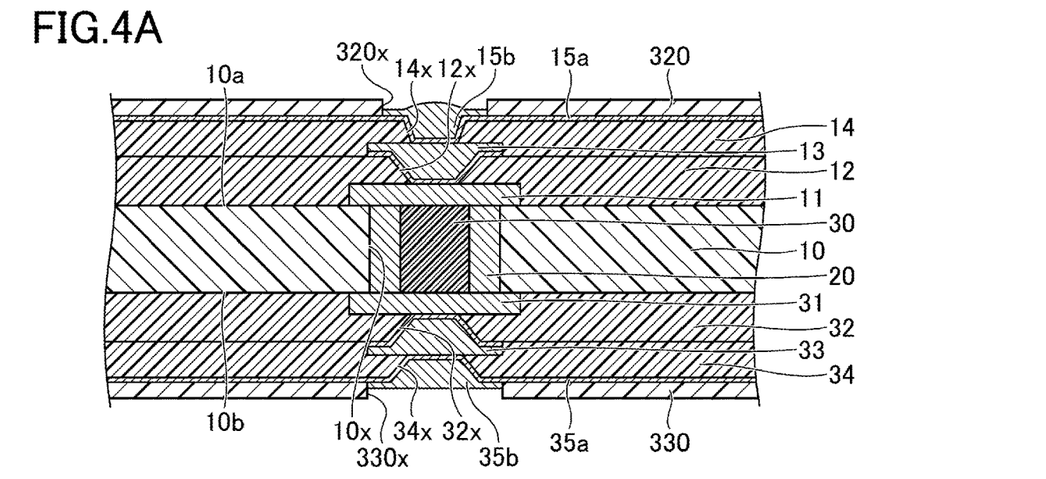
FIG. 4A, FIG. 4B, and FIG. 4C are diagrams (part 3) illustrating examples of the manufacturing processes of the wiring board according to the first embodiment.

Next, in the process (or step) illustrated in FIG. 4A, the via holes 14x and 34x are formed in the same manner as in the process (or step) illustrated in FIG. 2C. Then, a seed layer 15a is formed on the surface of the first insulating layer 14 including the inner wall of the via holes 14x, and the surface of the first interconnect layer 13 exposed inside the via holes 14x, by electroless plating of copper, sputtering of copper, or the like. Moreover, a seed layer 35a is formed on the surface of the third insulating layer 34 including the inner wall of the via hole 34x, and the surface of the third interconnect layer 33 exposed inside the via holes 34x, by electroless plating of copper, sputtering of copper, or the like. Next, a plating resist pattern 320, having an opening 320x corresponding to the shape of the interconnect pattern of the first interconnect layer 15, is formed on the seed layer 15a. Further, a plating resist pattern 330, having an opening 330x corresponding to the shape of the interconnect pattern of the third interconnect layer 35, is famed on the seed layer 35a.

Next, an electrolytic plating layer 15b is deposited on the seed layer 15a exposed inside the opening 320x of the plating resist pattern 320, by electrolytic plating of copper using the seed layer 15a as the power feeding layer. Further, an electrolytic plating layer 35b is deposited on the seed layer 35a exposed inside the opening 330x of the plating resist pattern 330, by electrolytic plating of copper using the seed layer 35a as the power feeding layer. The deposition of the electrolytic plating layer 15b is performed until a protrusion having a curved surface is famed on an upper surface of the electrolytic plating layer 15b.

The thickness of a thinnest portion of the electrolytic plating layer 15b (the thickness of an outer edge portion of the electrolytic plating layer 15b), with reference to the upper surface of the first insulating layer 14, can be in a range of approximately 15 μm to approximately 25 μm, for example. The thickness of a thickest portion of the electrolytic plating layer 15b (the thickness of a center portion of the electrolytic plating layer 15b), with reference to the upper surface of the first insulating layer, can be a sum of the thickness of the thinnest portion and a thickness in a range of approximately 3 μm to approximately 8 μm, for example. That is, a height of the protrusion formed on the upper surface of the electrolytic plating layer 15b can be in a range of approximately 3 μm to approximately 8 μm, for example.

A hole diameter of the via hole 14x can be made smaller than the hole diameter of each of the via holes 12x and 34x, in order to improve filling properties of the electrolytic plating layer 15b, and facilitate formation of the protrusion having the curved surface on the upper surface of the electrolytic plating layer 15b. In addition, the lower surface of the electrolytic plating layer 35b can be flat or include a protrusion having a curved surface. Moreover, in the case where the protrusion having the curved surface is formed on the lower surface of the electrolytic plating layer 35b, it is not necessary to polish and planarize the protrusion in a subsequent process (or step), because a fine (or micro) interconnect layer is not formed in the third interconnect structure 3.

Figure 4B:
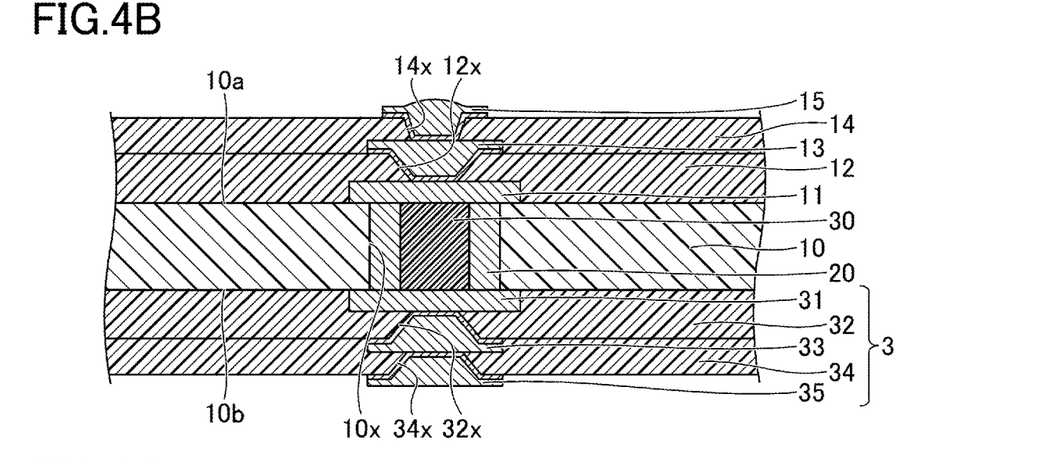

Next, in the process (or step) illustrated in FIG. 4B, the plating resist patterns 320 and 330 are removed. Then, etching is performed, using the electrolytic plating layer 15b as a mask, to remove the seed layer 15a exposed from the electrolytic plating layer 15b and form the first interconnect layer 15. In addition, etching is performed, using the electrolytic plating layer 35b as a mask, to remove the seed layer 35a exposed from the electrolytic plating layer 35b and form the third interconnect layer 35. By this process (or step), the third interconnect structure 3 is formed on the lower surface of the core substrate 10.

Figure 4C:
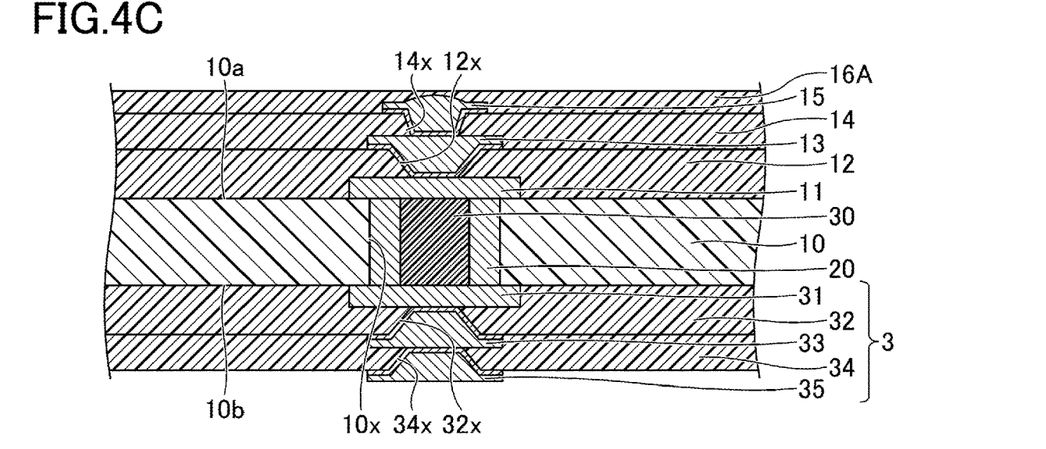

Next, in the process (or step) illustrated in FIG. 4C, a first insulating resin layer 16A, covering the side surface and the upper surface of the first interconnect layer 15, is formed by a method similar to the method of forming the first insulating layer 12. A material used for the first insulating resin layer 16A can be the same as that used for the first insulating layer 12, for example. The first insulating resin layer 16A has a thickness sufficient to cover the entire first interconnect layer 15 including the protrusion. The thickness of the first insulating resin layer 16A can be in a range of approximately 20 μm to approximately 40 μm, for example.

Figure 5A:
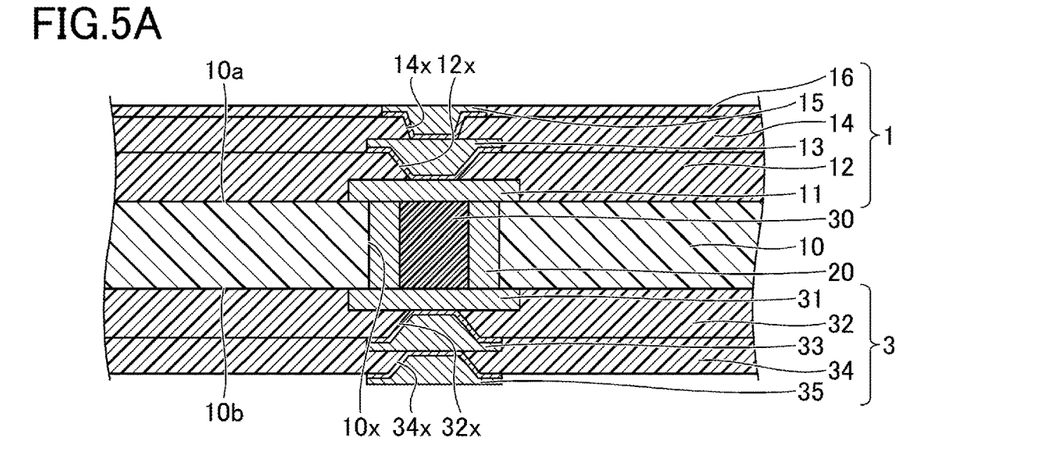
FIG. 5A, FIG. 5B, and FIG. 5C are diagrams (part 4) illustrating examples of the manufacturing processes of the wiring board according to the first embodiment.

Next, in the process (or step) illustrated in FIG. 5A, the first insulating resin layer 16A is polished, to form the first insulating layer 16 that covers the side surface of the first interconnect layer 15 and exposes the upper surface of the first interconnect layer 15. The first insulating resin layer 16A is polished until the upper surface of the first interconnect layer 15 becomes exposed from the upper surface of the first insulating layer 16, and the upper surface of the first interconnect layer 15 is planarized and becomes flat. That is, the protrusion formed on the upper surface of the first interconnect layer 15 is removed by the polishing, so that the upper surface of the first interconnect layer 15 coincides with the upper surface of the first insulating layer 16. For example, a chemical mechanical polishing (CMP) can be used for the polishing. The thickness of the interconnect pattern forming the first interconnect layer 15 after the polishing becomes identical to the thickness of the first insulating layer 16. The thickness of the first insulating layer 16 can be in a range of approximately 5 μm to approximately 15 μm, for example. The roughness Ra of the upper surface of the first insulating layer 16 after the polishing is smaller than the roughness Ra of the upper surface of the first insulating resin layer 16A before the polishing. The roughness Ra of the upper surface of the first insulating resin layer 16A before the polishing can be in a range of approximately 150 nm to approximately 200 nm, for example. By performing the polishing, the roughness Ra of the upper surface of the first insulating layer 16 can be reduced to a range of approximately 20 nm to approximately 60 nm, for example.

By this process (or step), the first interconnect structure 1 is formed on the upper surface of the core substrate 10. The roughness Ra of the upper surface of each of the first insulating layers 12 and 14 can be in a range of approximately 150 nm to approximately 200 nm, for example. That is, by the polishing in this process (or step), the roughness Ra of the upper surface of the first insulating layer 16 becomes smaller than the roughness Ra of the upper surface of each of the other insulating layers (the first insulating layers 12 and 14) forming the first interconnect structure 1. That is, the upper surface of the first insulating layer 16 is more planarized (or flatter) than the upper surface of each of the other insulating layers (the first insulating layers 12 and 14) forming the first interconnect structure 1. As described above, by reducing the roughness Ra of the upper surface of the first insulating layer 16 and planarizing the upper surface of the first insulating layer 16, a fine interconnect layer (high-density interconnect pattern) can be famed on the upper surface of the first insulating layer 16 in a subsequent process (or step).

Figure 5B:
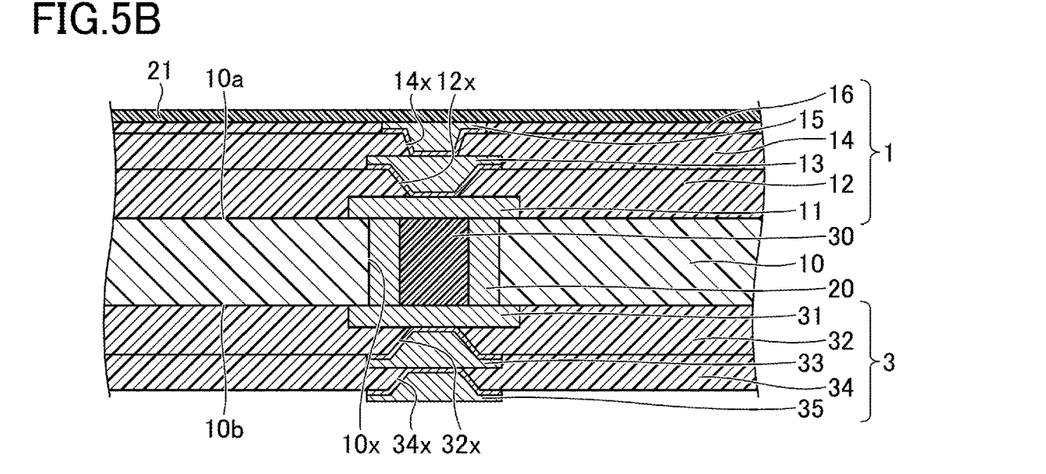

Next, in the process (or step) illustrated in FIG. 5B, an uncured film of a second insulating resin layer is disposed to cover the upper surface of the first interconnect layer 15 and the upper surface of the first insulating layer 16 of the first interconnect structure 1, and the second insulating resin layer is pressed toward the first interconnect structure 1 while being heated to be cured, thereby forming the second insulating layer 21. Alternatively, instead of laminating the film of the second insulating resin layer, a liquid or paste of the insulating resin can be coated and thereafter cured, to form the second insulating layer 21. This process (or step) is preferably performed in a vacuum, in order to fill the gap G with the second insulating layer 21, as illustrated in FIG. 1B.

A thermosetting resin, such as an epoxy-based resin, an imide-based resin, a phenol-based resin, a cyanate-based resin, or the like, can be used for the insulating resin forming the second insulating layer 21, for example.

The second insulating layer 21 preferably includes a thermosetting non-photosensitive resin, such as an epoxy-based resin, an imide-based resin, a phenol-based resin, a cyanate-based resin, or the like, as a main component thereof, for example. The second insulating layer 21 includes a filler 21f, such as silica ($SiO_2$) or the like, as illustrated in FIG. 1B. The average grain diameter and the maximum grain diameter of the filler 21f included in the second insulating layer 21 are respectively smaller than the average grain diameter and the maximum grain diameter of the filler 16f included in the first insulating layer 16. The average grain diameter of the filler 21f can be less than or equal to 0.1 nm, for example. The maximum grain diameter of the filler 21f can be less than or equal to 1 nm, for example. The filler content of the filler 21f can be approximately 50 wt %, for example. The second insulating layer 21 is an insulating layer thinner than each of the first insulating layers 12 and 14. A thickness of the second insulating layer 21 can be in a range of approximately 10 nm to approximately 20 μm, for example.

The second insulating layer 21 preferably includes the non-photosensitive resin as the main component thereof, for the following reasons. The non-photosensitive resin has a thermal expansion coefficient lower than that of the photosensitive resin. In addition, the non-photosensitive resin has a relative dielectric constant and a dielectric loss tangent (or dielectric loss factor) lower than those of the photosensitive resin. This is because physical property values of the non-photosensitive resin can be adjusted by including a filler, but including a filler in the photosensitive resin is difficult due to the exposure process or the like, and it is difficult to obtain satisfactory physical property values of the photosensitive resin when the filler is included therein.

Generally, the thermal expansion coefficient of the resin used for the insulating layer is larger than the thermal expansion coefficient of the metal, such as copper or the like, used for the interconnect layer. When a difference of the thermal expansion coefficients between the interconnect layer and the insulating layer is large, a stress is generated between the interconnect layer and the insulating layer due to the difference of the thermal expansion coefficients, and a delamination between the interconnect layer and the insulating layer, a break of the interconnect layer, or the like may occur. This tendency increases as the interconnect layer becomes finer. For this reason, the thermal expansion coefficient of the insulating layer is preferably as low as possible so as to be close to the thermal expansion coefficient of the interconnect layer. Accordingly, it is preferable to use a non-photosensitive resin, having a thermal expansion coefficient lower than that of the photosensitive resin, for the second insulating layer 21 forming the fine interconnect layer. The same applies to the other second insulating layers.

In addition, the lower the relative dielectric constant or the dielectric loss tangent of the insulating layer becomes, the easier it becomes for a high-frequency signal to flow through the interconnect layer. When the relative dielectric constant or the dielectric loss tangent of the insulating layer is high, a delay is generated in the signal flowing through the interconnect layer. This tendency increases as the interconnect layer becomes finer. Accordingly, in order to obtain excellent high-frequency characteristics, it is preferable to use a non-photosensitive resin, having a relative dielectric constant and a dielectric loss tangent lower than those of the photosensitive resin, for the second insulating layer 21 forming the fine interconnect layer. The same applies to the other second insulating layers.

After the polishing in the process (or step) illustrated in FIG. 5A, the gap G having a width of approximately 5 μm may be formed between the outer edge of the interconnect pattern forming the first interconnect layer 15 and the first insulating layer 16, as illustrated in FIG. 1B. However, when forming the second insulating layer 21 in the process (or step) illustrated in FIG. 5B, the softened second insulating resin layer fills the gap G and is thereafter cured, so that the gap G finally disappears. As a result, it is possible to reduce the generation of cracks in the first interconnect layer 15 and the first insulating layer 16. In addition, because a portion of the second insulating layer 21 enters inside the gap G, an anchor effect occurs, and it is possible to improve the adhesion between the second insulating layer 21 and each the first interconnect layer 15 and the first insulating layer 16. The gap G may not be formed after the polishing in the process (or step) illustrated in FIG.

Figure 5C:
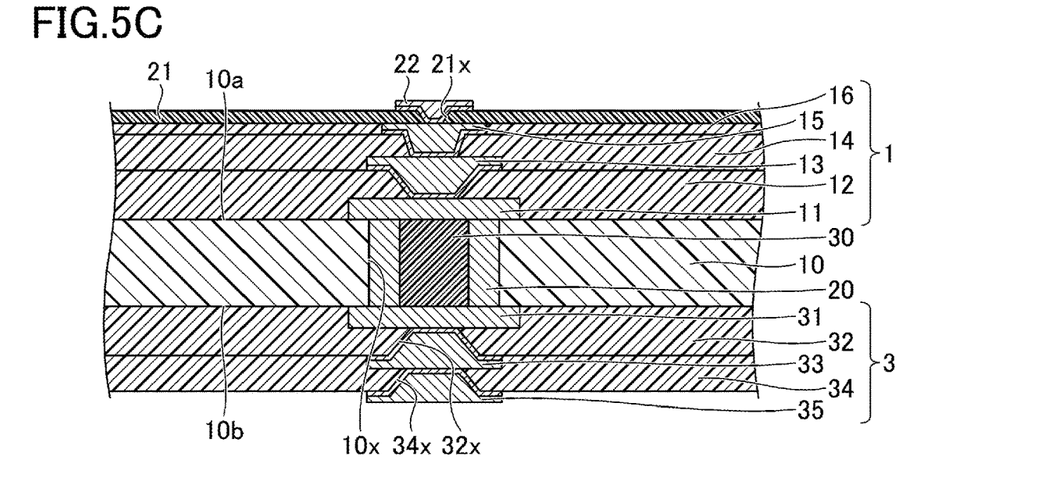

Next, in the process (or step) illustrated in FIG. 5C, the via hole 21x is formed in the same manner as in the process (or step) illustrated in FIG. 2C. The via hole 21x has an inverted truncated cone shape, similar to the other via holes. A hole diameter of the via hole 21x can be in a range of approximately 5 μm to approximately 10 μm, for example. Next, the second interconnect layer 22 is formed in the same manner as in FIG. 4A and FIG. 4B. The line-and-space of the second interconnect layer 22 can be in a range of approximately 3 μm/3 μm to approximately 8 μm/8 μm, for example. Because each via hole of the second interconnect structure 2, including the via hole 21x, has the hole diameter smaller than that of each via hole of the first interconnect structure 1, each via holes of the second interconnect structure 2 is preferably formed using an excimer laser suitable for fine processing.

Figure 6A:
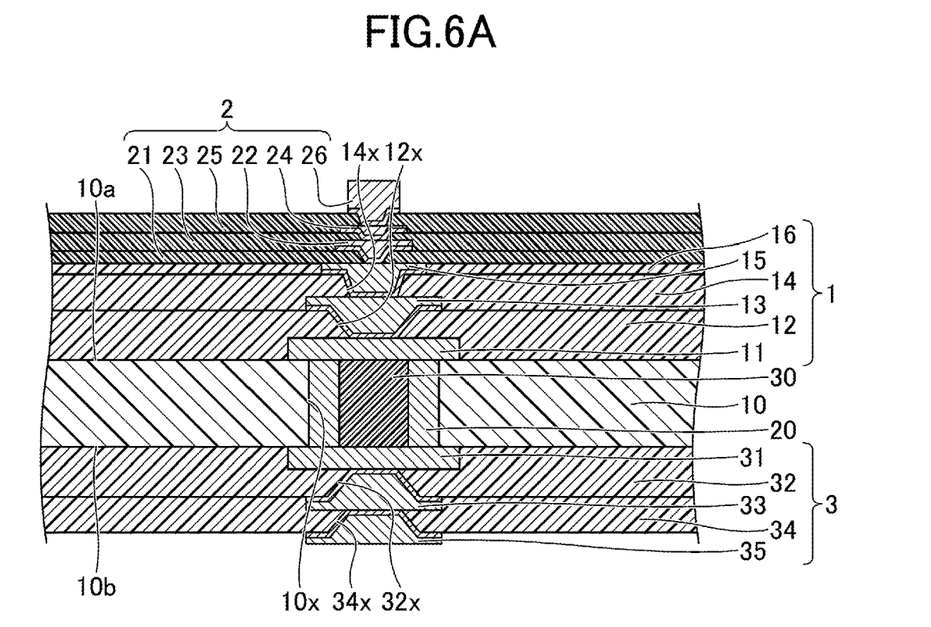
FIG. 6A and FIG. 6B are diagrams (part 5) illustrating examples of the manufacturing processes of the wiring board according to the first embodiment.

Next, in the process (or step) illustrated in FIG. 6A, processes similar to those illustrated in FIG. 4A and FIG. 4B are repeated, to successively laminate the second insulating layer 23, the second interconnect layer 24, the second insulating layer 25, and the second interconnect layer 26. By this process (or step), the second interconnect structure 2 is famed on the first interconnect structure 1.

Figure 6B:
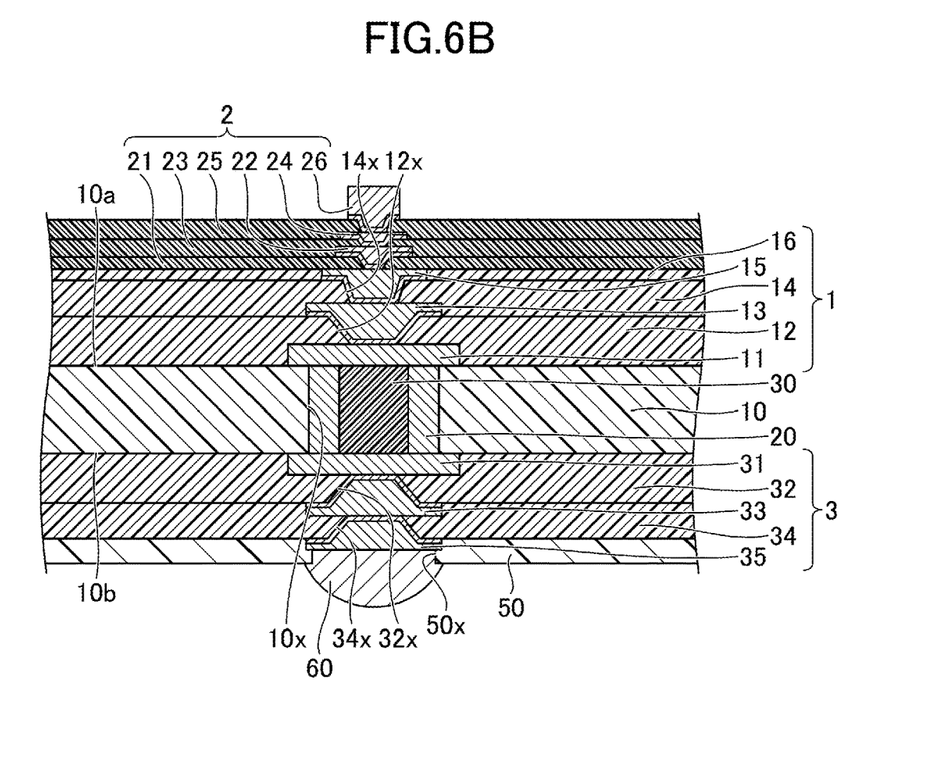

Next, in the process (or step) illustrated in FIG. 6B, the solder resist layer 40 illustrated in FIG. 1A having the opening 40x is formed on the second insulating layer 25. In addition, the solder resist layer 50 having the opening 50x is formed on the third interconnect layer 35. Then, the external connection terminal 60, such as the solder ball or the like, is formed on the third interconnect layer 35 exposed from the opening 50x of the solder resist layer 50. The wiring board 5 is completed by the processes (or steps) described heretofore.

Application Example of First Embodiment

Figure 7:
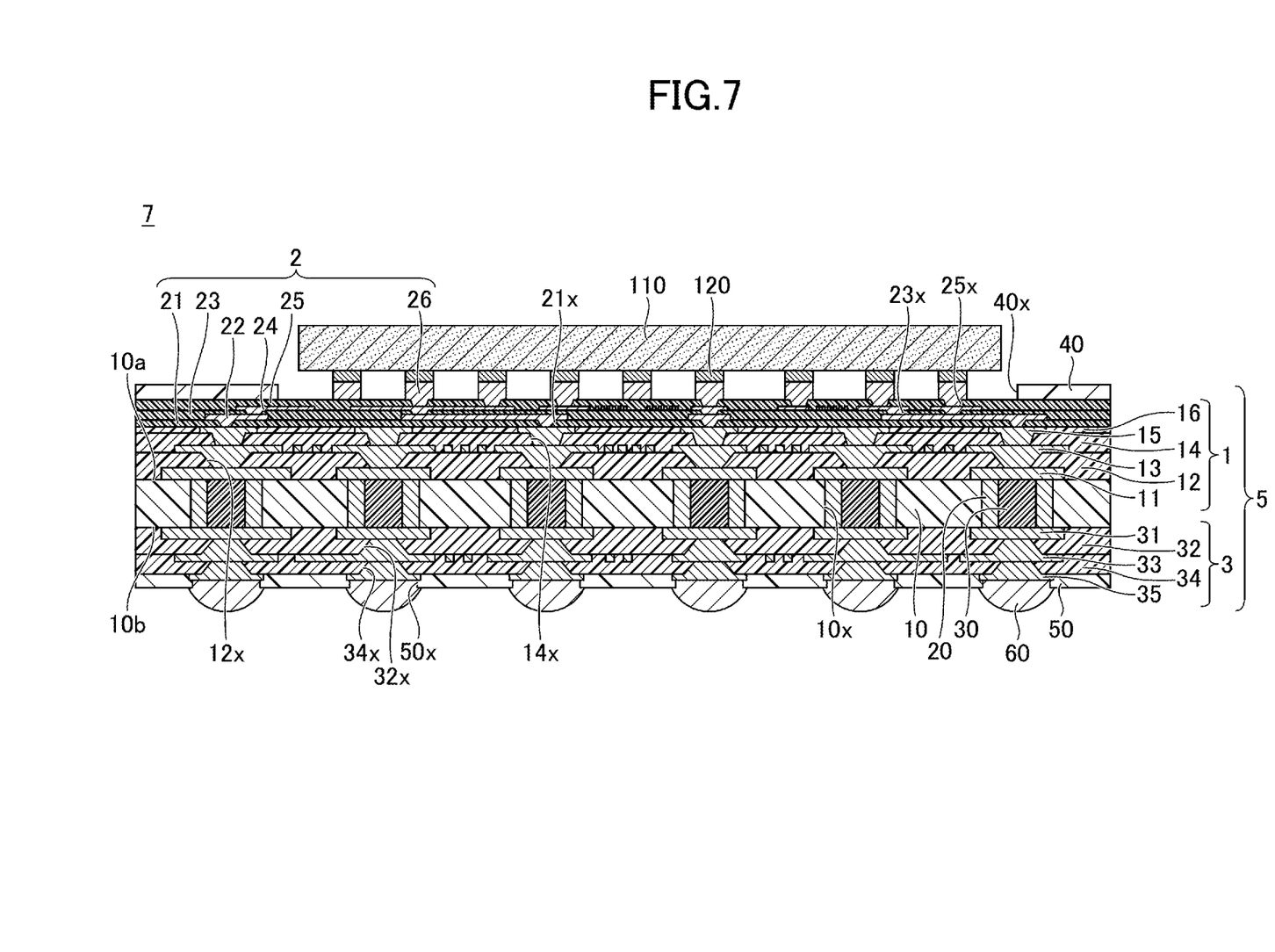
FIG. 7 is a cross sectional view illustrating an example of a semiconductor device according to an application example of the first embodiment.

In an application example of the first embodiment, an example of a semiconductor device having a semiconductor chip mounted on the wiring board will be described. In the application example of the first embodiment, a description of the constituent elements that are the same as those of the embodiment described above may be omitted.

FIG. 7 is a cross sectional view illustrating the semiconductor device according to the application example of the first embodiment. As illustrated in FIG. 7, a semiconductor device 7 includes the wiring board 5 illustrated in FIG. 1, a semiconductor chip 110, and electrode posts 120.

The semiconductor chip 110 has a semiconductor integrated circuit (not illustrated) or the like formed on a thinned semiconductor substrate (not illustrated) made of silicon or the like, for example. The electrode posts 120, electrically connected to the semiconductor integrated circuit (not illustrated), are formed on the semiconductor substrate (not illustrated). The electrode posts 120 can be copper posts, for example.

The electrode post 120 is electrically connected to the second interconnect layer 26 of the wiring board 5. The electrode post 120 and the second interconnect layer 26 can be directly connected by diffusion bonding or the like, or can be indirectly connected via a solder bump or the like, for example. In the latter case, the solder bump material can be an alloy including Pb, an alloy of Sn and Cu, an alloy of Sn and Ag, an alloy of Sn, Ag and Cu, or the like, for example. An underfill resin can be filled between the semiconductor chip 110 and the upper surface of the wiring board 5.

As described above, the semiconductor device 7 can be obtained by mounting the semiconductor chip 110 on the wiring board 5 according to the first embodiment. Because the semiconductor device 7 includes the wiring board 5 capable of reducing the generation of cracks in the interconnect layer and the insulating layer, a highly reliable semiconductor device can be provided.

Although preferred embodiments are described above in detail, the present invention is not limited to the above described embodiments, and various variations, modifications, and substitutions can be made in the above described embodiments without departing from the scope of the present invention.

For example, the present invention is also applicable to a coreless wiring board in which a second interconnect structure is laminated on a first interconnect structure, and having no core substrate and no third interconnect structure.

According to the disclosed technique, it is possible to provide a wiring board capable of reducing generation of cracks in the interconnect layer and the insulating layer.

Various aspects of the subject-matter described herein can be set out non-exhaustively in the following numbered clauses:

1. A method for manufacturing a wiring board comprising a first interconnect structure including a first interconnect layer and a first insulating layer, and second interconnect structure including a second interconnect layer and a second insulating layer and disposed on the first interconnect structure, the method comprising:
    forming the first interconnect layer;
    forming a first insulating resin layer covering a side surface and an upper surface of the first interconnect layer;
    forming the first insulating layer covering a side surface of the first interconnect layer and exposing an upper surface of the first interconnect layer, by polishing the first insulating resin layer;
    forming the second insulating layer, by disposing an uncured second insulating resin layer covering the upper surface of the first interconnect layer and an upper surface of the first insulating layer, and curing the second insulating resin layer by pressing the second insulating resin layer toward the first interconnect structure while heating the second insulating resin layer; and
    forming the second interconnect layer on the second insulating layer, wherein
    an interconnect width and an interconnect spacing of the second interconnect layer are respectively smaller than an interconnect width and an interconnect spacing of the first interconnect layer,
    the first insulating layer and the second insulating layer respectively include a filler, and
    an average grain diameter and a maximum grain diameter of the filler included in the second insulating layer are respectively smaller than an average grain diameter and a maximum grain diameter of the filler included in the first insulating layer.

2. The method for manufacturing the wiring board according to clause 1, wherein the average grain diameter of the filler included in the second insulating layer is less than or equal to 0.1 μm, and the maximum grain diameter of the filler included in the second insulating layer is less than or equal to 1 μm.

3. The method for manufacturing the wiring board according to clause 1 or 2, wherein
    the forming the first interconnect layer forms a protrusion having a curved surface shape on the upper surface of the first interconnect layer, and
    the forming the first insulating layer removes the protrusion by the polishing, so that the upper surface of the first interconnect layer coincides with the upper surface of the first insulating layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring board comprising:
    a first interconnect structure including an insulating layer, and a first interconnect layer and a first insulating layer that are disposed on and in contact with an upper surface of the insulating layer; and
    a second interconnect structure, including a second interconnect layer and a second insulating layer, and disposed on the first interconnect structure, wherein:
    the first interconnect layer includes a first via interconnect embedded in the insulating layer, and a first interconnect pattern connected to the first via interconnect and disposed on and in contact with the upper surface of the insulating layer,
    the first via interconnect has an inverted truncated cone shape with a diameter that gradually decreases downward toward a lower surface of the insulating layer,
    an interconnect width and an interconnect spacing of the second interconnect layer are respectively smaller than an interconnect width and an interconnect spacing of the first interconnect layer,
    the first insulating layer covers the upper surface of the insulating layer and a side surface of the first interconnect layer, and exposes an upper surface of the first interconnect layer,
    the upper surface of the first insulating layer and the upper surface of the first interconnect layer are coplanar,
    the second insulating layer covers the upper surface of the first interconnect layer and an upper surface of the first insulating layer,
    the first insulating layer and the second insulating layer include a filler, and
    an average grain diameter and a maximum grain diameter of the filler included in the second insulating layer are respectively smaller than an average grain diameter and a maximum grain diameter of the filler included in the first insulating layer.

2. The wiring board as claimed in claim 1, wherein the average grain diameter of the filler included in the second insulating layer is less than or equal to 0.1 μm, and the maximum grain diameter of the filler included in the second insulating layer is less than or equal to 1 μm.

3. The wiring board as claimed in claim 1, wherein the first insulating layer and the second insulating layer are insulating layers including a non-photosensitive resin as a main component thereof.

4. The wiring board as claimed in claim 1, wherein:
the first interconnect structure includes a plurality of first interconnect layers and a plurality of first insulating layers,
the second interconnect structure includes a plurality of second interconnect layers and a plurality of second insulating layers,
the plurality of first interconnect layers includes an uppermost first interconnect layer disposed closest to the second interconnect structure among the plurality of first interconnect layers,
the plurality of first insulating layers includes an uppermost first insulating layer that is disposed closest to the second interconnect structure among the plurality of first insulating layers, the uppermost first insulating layer covering a side surface of the uppermost first interconnect layer and exposing an upper surface of the uppermost first interconnect layer,
the plurality of second insulating layers includes a lowermost second insulating layer covering the upper surface of the uppermost first interconnect layer and an upper surface of the uppermost first insulating layer,
the uppermost first insulating layer and the lowermost second insulating layer respectively include a filler, and
an average grain diameter and a maximum grain diameter of the filler included in the lowermost second insulating layer are respectively smaller than an average grain diameter and a maximum grain diameter of the filler included in the uppermost first insulating layer.

5. The wiring board as claimed in claim 4, wherein:
all of the plurality of first insulating layers and all of the plurality of second insulating layers respectively include a filler, and
an average grain diameter and a maximum grain diameter of the filler included in each second insulating layer of the plurality of second insulating layers are respectively smaller than an average grain diameter and a maximum grain diameter of the filler included in each first insulating layer of the plurality of first insulating layers.

6. The wiring board as claimed in claim 4, wherein a roughness of the upper surface of the uppermost first insulating layer is smaller than a roughness of the upper surface of each first insulating layer of the plurality of first insulating layers other than the uppermost first insulating layer.

7. The wiring board as claimed in claim 4, further comprising:
a core substrate; and
a third interconnect structure including a plurality of third interconnect layers and a plurality of third insulating layers that are laminated, wherein
the first interconnect structure and the second interconnect structure are disposed on one side of the core substrate,
the third interconnect structure is disposed on the other side of the core substrate, and
an interconnect width and an interconnect spacing of the second interconnect layer are smaller than an interconnect width and an interconnect spacing of the plurality of third interconnect layers.

8. The wiring board as claimed in claim 4, wherein:
an uppermost first interconnect layer of the plurality of first interconnect layers includes a via interconnect positioned within one first insulating layer of the plurality of first insulating layers disposed immediately below the uppermost first interconnect layer, and an interconnect pattern connected to the via interconnect and disposed on the one first insulating layer, and
an upper surface of the interconnect pattern and an upper surface of an uppermost first insulating layer of the plurality of first insulating layers disposed directly on the one first insulating layer are coplanar.

9. The wiring board as claimed in claim 4, further comprising:
a core substrate, wherein the first interconnect structure includes:
a first interconnect pattern formed by a lowermost first interconnect layer of the plurality of first interconnect layers disposed on an upper surface of the core substrate,
a lowermost first insulating layer of the plurality of first insulating layers covering the upper surface of the core substrate and the lowermost first interconnect layer,
a via interconnect positioned within the lowermost first insulating layer and connected to the first interconnect pattern, and
a second interconnect pattern connected to the via interconnect and disposed on the lowermost first insulating layer.

10. The wiring board as claimed in claim 9, wherein the core substrate includes:
a through hole penetrating the core substrate,
a via electrode provided on an internal wall surface of the through hole, and
a resin part filling a center portion of the through hole.

11. The wiring board as claimed in claim 1, wherein a content of the filler included in the first insulating layer is greater than a content of the filler included in the second insulating layer.

12. The wiring board as claimed in claim 1, wherein the second insulating layer is disposed on and in contact with the upper surface of the first interconnect layer and an upper surface of the first insulating layer.

13. The wiring board as claimed in claim 1, wherein a roughness of the upper surface of the first insulating layer is smaller than a roughness of the upper surface of the insulating layer.

14. The wiring board as claimed in claim 1, wherein the first insulating layer has a thickness identical to a thickness of the interconnect pattern of the first interconnect layer.

15. The wiring board as claimed in claim 1, wherein:
the second interconnect layer includes a second via interconnect embedded in the second insulating layer, and a second interconnect pattern connected to the second via interconnect and disposed on and in contact with the upper surface of the second insulating layer, and
the second via interconnect has an inverted truncated cone shape with a diameter that gradually decreases downward toward a lower surface of the second insulating layer.

16. The wiring board as claimed in claim 1, wherein the first interconnect pattern is not embedded in the insulating layer.

17. A wiring board comprising:
a first interconnect structure including an insulating layer, and a first interconnect layer and a first insulating layer that are disposed on and in contact with an upper surface of the insulating layer; and
a second interconnect structure, including a second interconnect layer and a second insulating layer, and disposed on the first interconnect structure, wherein:

the first interconnect layer includes a first via interconnect embedded in the insulating layer, and a first interconnect pattern connected to the first via interconnect and disposed on and in contact with the upper surface of the insulating layer, the first via interconnect has an inverted truncated cone shape with a diameter that gradually decreases downward toward a lower surface of the insulating layer, an interconnect width and an interconnect spacing of the second interconnect layer are respectively smaller than an interconnect width and an interconnect spacing of the first interconnect layer, the first insulating layer covers the upper surface of the insulating layer and a side surface of the first interconnect layer, and exposes an upper surface of the first interconnect layer, the second insulating layer covers the upper surface of the first interconnect layer and an upper surface of the first insulating layer, the first insulating layer and the second insulating layer include a filler, an average grain diameter and a maximum grain diameter of the filler included in the second insulating layer are respectively smaller than an average grain diameter and a maximum grain diameter of the filler included in the first insulating layer, and a roughness of the upper surface of the first insulating layer is smaller than a roughness of the upper surface of the insulating layer.

18. The wiring board as claimed in claim 17, wherein the first insulating layer has a thickness identical to a thickness of the interconnect pattern of the first interconnect layer.

19. A wiring board comprising:
a first interconnect structure including an insulating layer, and a first interconnect layer and a first insulating layer that are disposed on and in contact with an upper surface of the insulating layer; and a second interconnect structure, including a second interconnect layer and a second insulating layer, and disposed on the first interconnect structure, wherein:

the first interconnect layer includes a first via interconnect embedded in the insulating layer, and a first interconnect pattern connected to the first via interconnect and disposed on and in contact with the upper surface of the insulating layer, the first via interconnect has an inverted truncated cone shape with a diameter that gradually decreases downward toward a lower surface of the insulating layer, an interconnect width and an interconnect spacing of the second interconnect layer are respectively smaller than an interconnect width and an interconnect spacing of the first interconnect layer, the first insulating layer covers the upper surface of the insulating layer and a side surface of the first interconnect layer, and exposes an upper surface of the first interconnect layer, the second insulating layer covers the upper surface of the first interconnect layer and an upper surface of the first insulating layer, the first insulating layer and the second insulating layer include a filler, an average grain diameter and a maximum grain diameter of the filler included in the second insulating layer are respectively smaller than an average grain diameter and a maximum grain diameter of the filler included in the first insulating layer, and the first insulating layer has a thickness identical to a thickness of the interconnect pattern of the first interconnect layer.

* * * * *